(12) United States Patent
Zhang

(10) Patent No.: US 11,543,449 B1
(45) Date of Patent: Jan. 3, 2023

(54) SELF-TEST SYSTEM FOR PCIE AND METHOD THEREOF

(71) Applicants: Inventec (Pudong) Technology Corporation, Shanghai (CN); Inventec Corporation, Taipei (TW)

(72) Inventor: Tian-Chao Zhang, Shanghai (CN)

(73) Assignees: Inventec (Pudong) Technology Corporation, Shanghai (CN); Inventec Corporation, Taipei (TW)

(*) Notice: Subject to any disclaimer, the term of this patent is extended or adjusted under 35 U.S.C. 154(b) by 0 days.

(21) Appl. No.: 17/484,819

(22) Filed: Sep. 24, 2021

(30) Foreign Application Priority Data

Sep. 15, 2021 (CN) .......................... 202111079043.X

(51) Int. Cl.
*G01R 31/28* (2006.01)
*G01R 31/3183* (2006.01)
*G01R 31/3181* (2006.01)

(52) U.S. Cl.
CPC ..... *G01R 31/2853* (2013.01); *G01R 31/2884* (2013.01); *G01R 31/2889* (2013.01); *G01R 31/31813* (2013.01); *G01R 31/318314* (2013.01)

(58) Field of Classification Search
CPC ............ G01R 31/2853; G01R 31/2884; G01R 31/2889; G01R 31/31813; G01R 31/318314

USPC ......................................... 324/538, 537, 500
See application file for complete search history.

(56) References Cited

U.S. PATENT DOCUMENTS

| | | | |
|---|---|---|---|
| 2017/0262388 A1* | 9/2017 | Lin | G06F 13/1668 |
| 2020/0394076 A1* | 12/2020 | Chan | G06F 9/5022 |
| 2021/0405873 A1* | 12/2021 | Lu | G06F 3/061 |

* cited by examiner

*Primary Examiner* — Giovanni Astacio-Oquendo
(74) *Attorney, Agent, or Firm* — David R. Stevens; Stevens Law Group

(57) ABSTRACT

A self-test system for PCIe and a method thereof are disclosed. In the system, a first circuit interconnect card and a second circuit interconnect card are inserted into CEM slots, respectively, and the first circuit interconnect card and the second circuit interconnect card are electrically connected to each other through a FFC, the central processing unit generates and provides differential signals to the first circuit interconnect card and the second circuit interconnect card; the first circuit interconnect card or the second circuit interconnect card provide differential signals to the second circuit interconnect card or the first circuit interconnect card through the first FFC interface and the second FFC interface, respectively, and the second circuit interconnect card or the first circuit interconnect card provides the differential signals to a central processing unit, so as to implement self-check for PCIe.

10 Claims, 5 Drawing Sheets

SELF-TEST SYSTEM FOR PCIE AND METHOD THEREOF

CROSS-REFERENCE TO RELATED APPLICATION

This application claims the benefit of Chinese Application Serial No. 202111079043.X, filed Sep. 15, 2021, which is hereby incorporated herein by reference in its entirety.

BACKGROUND OF THE INVENTION

Field of the Invention

The present invention is related to a testing system and a method thereof, and more particularly to a self-test system using circuit interconnect card interconnect to implement self-check for differential signals of PCIe, and a method thereof.

Description of the Related Art

The conventional testing method for peripheral component interconnect express (PCIe) on the board generally is to insert different functional test cards into PCIe to detect the corresponding PCIe function. Each PCIe needs to be inserted with a functional test card corresponding thereto, so the tests for different functions of PCIe require a large number of function test cards.

However, in fact, it only needs to detect electrical characteristics of the PCIe to ensure production quality, and the test for the electrical characteristics of the PCIe only needs to test the connectivity and high frequency characteristics of signal but does not need the test for data transmission. Therefore, the conventional test for PCIe should be adjusted with the times.

According to the above-mentioned contents, what is needed is to develop an improved technical solution to solve the conventional technology problem that the conventional PCIe test performing full data transmission test causes inconvenience in test.

SUMMARY OF THE INVENTION

An objective of the present invention is to provide a self-test system for PCIe and a method thereof, so as to solve the conventional technology problem that the conventional PCIe test performing full data transmission test causes inconvenience in test.

In order to achieve the objective, the present invention discloses a self-test system for PCIe, and the self-test system includes a first circuit interconnect card, at least one second circuit interconnect card and a board under test. The first circuit interconnect card includes a first card electromechanical (CEM) insertion interface, and two first flexible flat cable (FFC) interfaces electrically connected to the first CEM insertion interface. Each second circuit interconnect card includes a second CEM insertion interface, and two second FFC interfaces electrically connected to the second CEM insertion interface. The board under test includes at least two CEM slots and a central processing unit. The at least two CEM slots are inserted with the first CEM insertion interface of the first circuit interconnect card and the second CEM insertion interface of the at least one second circuit interconnect card, respectively, wherein electrical connections between the two first FFC interfaces of the first circuit interconnect card and the two second FFC interfaces of the second circuit interconnect card through FFCs are determined based on bandwidths of the at least two CEM slots respectively inserted with the first circuit interconnect card and the at least one second circuit interconnect card. The central processing unit is electrically connected to the at least two CEM slots, and configured to generate and provide differential signals to one of the first circuit interconnect card and the second circuit interconnect card through the corresponding one of the at least two CEM slots, wherein the first circuit interconnect card or the second circuit interconnect card provides the differential signals to the second circuit interconnect card or the first circuit interconnect card through the first FFC interface or the second FFC interface, and the second circuit interconnect card or the first circuit interconnect card provides the differential signals to the central processing unit through the at least two CEM slots inserted with the another second circuit interconnect card and the first circuit interconnect card, so as to implement the self-check of the differential signals for the at least two CEM slots.

In order to achieve the objective, the present invention discloses a self-test method for PCIe, and the self-test method includes steps of: providing a first circuit interconnect card including a first CEM insertion interface and two first FFC interfaces; providing a second circuit interconnect card including a second CEM insertion interface and two second FFC interfaces; providing a board under test (BUT) including at least two CEM slots and a central processing unit; electrically connecting the first FFC interface and the first CEM insertion interface; electrically connecting the second FFC interface and the second CEM insertion interface; inserting the first CEM insertion interface of the first circuit interconnect card and the second CEM insertion interface of the second circuit interconnect card into the at least two CEM slots, respectively, wherein electrically connections between the first FFC interface of the first circuit interconnect card and the second FFC interface of the second circuit interconnect card through FFCs is determined based on bandwidths of the at least two CEM slots inserted with the first circuit interconnect card and the second circuit interconnect card; electrically connecting the central processing unit and the at least two CEM slots; generating differential signals by the central processing unit; providing the differential signals to the first circuit interconnect card or the second circuit interconnect card by the central processing unit, through the one of the at least two CEM slots; providing the differential signals to the second circuit interconnect card or the first circuit interconnect card by the first circuit interconnect card or the second circuit interconnect card, through the first FFC interface or the second FFC interface; providing the differential signals to the central processing unit by the second circuit interconnect card or the first circuit interconnect card, through one of the at least two CEM slots inserted with the second circuit interconnect card or the first circuit interconnect card, so as to implement the self-check of the differential signals of the at least two CEM slots.

According to the above-mentioned system and method of the present invention, the difference between the conventional technology and the present invention is that, in the invention, the first circuit interconnect card and a second circuit interconnect card are inserted into the CEM slots, respectively, and the first circuit interconnect card and the second circuit interconnect card are electrically connected to each other through the FFCs; the central processing unit generates and provides the differential signals to the first circuit interconnect card or the second circuit interconnect card, and the first circuit interconnect card or the second circuit interconnect card provides the differential signals to the second circuit interconnect card or the first circuit interconnect card through the first FFC interface and the second FFC interface; the second circuit interconnect card or the first circuit interconnect card then provides the differential signals to the central processing unit, so as to implement the self-test for the differential signals of the CEM slots.

Therefore, the technical solution of the present invention is able to achieve the technical effect of implementing the self-check for differential signal of PCIe by means of the circuit interconnect card.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
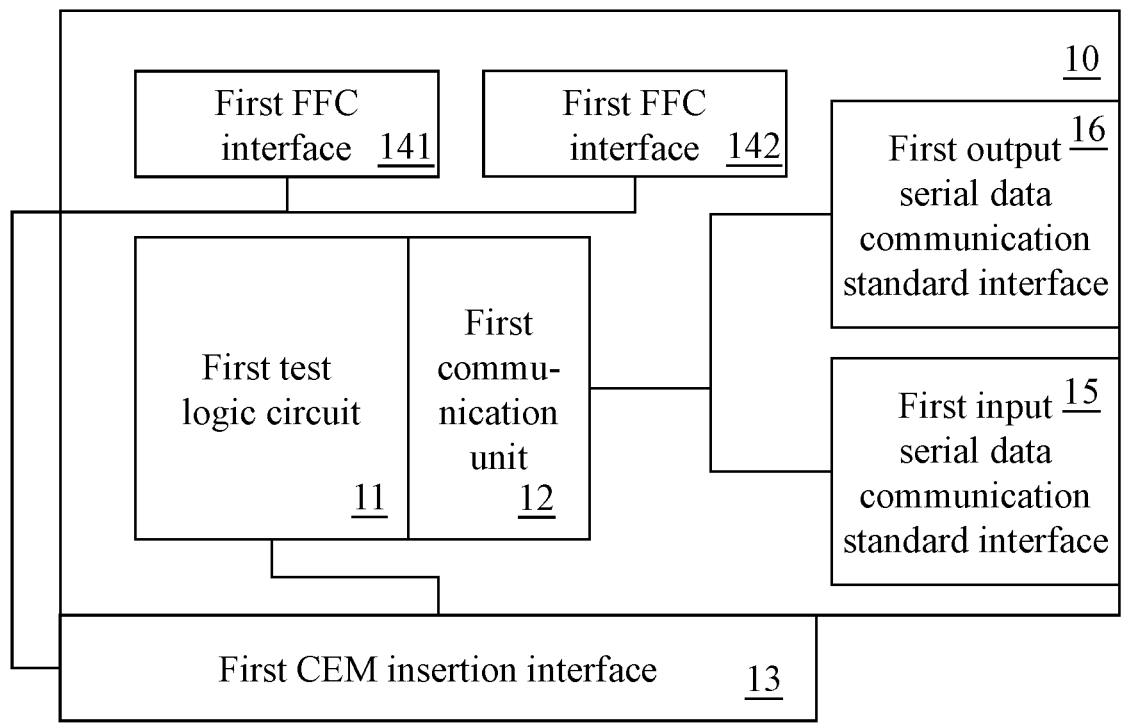
FIG. 1 is a block diagram of a first circuit interconnect card, according to a self-test system of the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

Please refer to FIG. 1, which is a block diagram of a first circuit interconnect card, according to a self-test system of the present invention.

As shown in FIG. 1, a first circuit interconnect card 10 includes a first CEM insertion interface 13, a first FFC interface 141, a first FFC interface 142, a first test logic circuit 11, a first communication unit 12, a first input serial data communication standard interface 15, and a first output serial data communication standard interface 16.

The first communication unit 12 and the first test logic circuit 11 form electrical connection; the first CEM insertion interface 13, the first FFC interface 141 and the first FFC interface 142 form electrical connection; the first input serial data communication standard interface 15, the first output serial data communication standard interface 16 and the first communication unit 12 form electrical connection.

Figure 2:
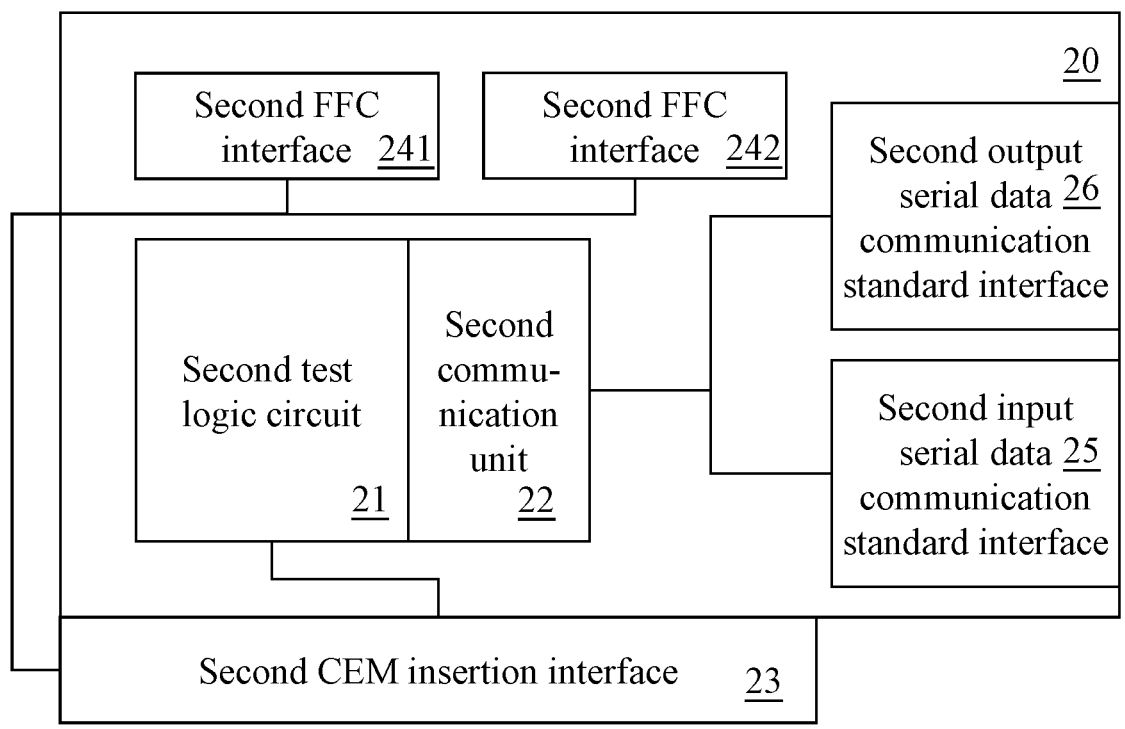
FIG. 2 is a block diagram of a second circuit interconnect card, according to a self-test system of the present invention.

Please refer to FIG. 2, which is a block diagram of a second circuit interconnect card, according to a self-test system of the present invention.

The second circuit interconnect card 20 includes a second CEM insertion interface 23, a second FFC interface 241, a second FFC interface 242, a second test logic circuit 21, a second communication unit 22, a second input serial data communication standard interface 25 and a second output serial data communication standard interface 26.

The second communication unit 22 and the second test logic circuit 21 form electrical connection; the second CEM insertion interface 23, the second FFC interface 241 and the second FFC interface 242 form electrical connection; the second input serial data communication standard interface 25, the second output serial data communication standard interface 26 and the second communication unit 22 form electrical connection.

Figure 3:
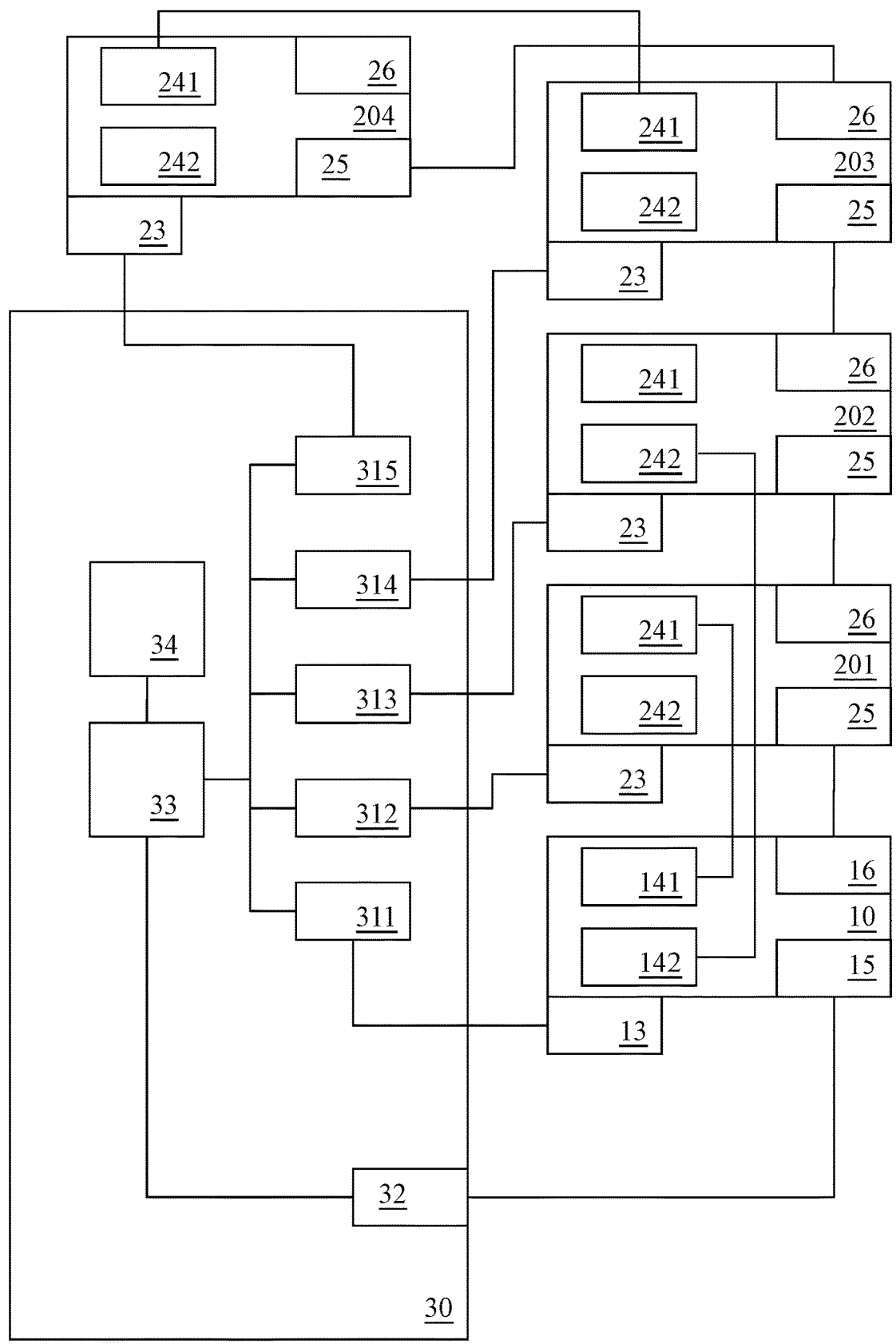
FIG. 3 is a schematic diagram of a first circuit interconnect card and second circuit interconnect cards electrically connected to a board under test for self-test of PCIe, according to a self-test system of the present invention.

Please refer to FIG. 3, which is a schematic diagram of a first circuit interconnect card and second circuit interconnect cards electrically connected to a board under test for self-test of PCIe, according to a self-test system of the present invention.

The board under test 30 includes a first CEM slot 311, a second CEM slot 312, a third CEM slot 313, a fourth CEM slot 314, a fifth CEM slot 315 and a central processing unit 33; the central processing unit 33 is electrically connected to the first CEM slot 311, the second CEM slot 312, the third CEM slot 313, the fourth CEM slot 314 and the fifth CEM slot 315. A bandwidth of the first CEM slot 311 is X16, and a bandwidth of each of the second CEM slot 312, the third CEM slot 313, the fourth CEM slot 314 and the fifth CEM slot 315 is X8; however, these examples are merely for exemplary illustration, and the application field of the present invention is not limited to these examples. The board under test 30 can include an output serial data communication standard interface 32 and a storage unit 34; the output serial data communication standard interface 32, the storage unit 34 and the central processing unit 33 form electrical connection.

As shown in FIG. 3, the second circuit interconnect card 201, the second circuit interconnect card 202, the second circuit interconnect card 203 and the second circuit interconnect card 204 are just schematic examples of the at least two second circuit interconnect cards; the first CEM slot 311, the second CEM slot 312, the third CEM slot 313, the fourth CEM slot 314 and the fifth CEM slot 315 are just schematic examples of the at least two CEM slots, and the present disclosure is not limited to above-mentioned examples.

The first circuit interconnect card 10 is electrically connected to the first CEM slot 311 through the first CEM insertion interface 13, the second circuit interconnect card 201 is electrically connected to the second CEM slot 312 through the second CEM insertion interface 23 thereof, the second circuit interconnect card 202 is electrically connected to the third CEM slot 313 through the second CEM insertion interface 23 thereof, the second circuit interconnect card 203 is electrically connected to the fourth CEM slot 314 through the second CEM insertion interface 23 thereof, and the second circuit interconnect card 204 is electrically connected to the fifth CEM slot 315 through the second CEM insertion interface 23 thereof.

It is worth mentioning that the electrical connections between the first FFC interface 141 and the first FFC interface 142 of the first circuit interconnect card 10, and the second FFC interfaces 241 and the second FFC interfaces 242 of the second circuit interconnect card 201, the second circuit interconnect card 202, the second circuit interconnect card 203 and the second circuit interconnect card 204 through FFCs are determined based on the bandwidths of the first CEM slot 311, the second CEM slot 312, the third CEM slot 313, the fourth CEM slot 314 and fifth CEM slot 315, which are respectively inserted with the first circuit interconnect card 10, the second circuit interconnect card 201, the second circuit interconnect card 202, the second circuit interconnect card 203 and the second circuit interconnect card 204.

As shown in FIG. 3, the bandwidth of the first CEM slot 311, which is inserted with the first circuit interconnect card 10, is X16; the bandwidth of the second CEM slot 312, which is inserted with the second circuit interconnect card 201, is X8; the bandwidth of the third CEM slot 313, which is inserted with the second circuit interconnect card 202, is X8. For the first circuit interconnect card 10, the manner of electrical connection through the FFC can be that the first FFC interface 141 of the first circuit interconnect card 10 is electrically connected to the second FFC interface 241 (alternatively, the second FFC interface 242) of the second circuit interconnect card 201 through the FFC, and the first FFC interface 142 of the first circuit interconnect card 10 is electrically connected to the second FFC interface 242 (alternatively, the second FFC interface 241) of the second circuit interconnect card 202 through the FFC.

As shown in FIG. 3, the bandwidth of the fourth CEM slot 314, which is inserted with the second circuit interconnect card 203, is X8; the bandwidth of the fifth CEM slot 315, which is inserted with the second circuit interconnect card 204, is X8; for the second circuit interconnect cards 203 and 204, the electrical connection through the FFC can be that the second FFC interface 241 (alternatively, the second FFC interface 242) of the second circuit interconnect card 203 is electrically connected to the second FFC interface 241 (alternatively, the second FFC interface 242) of the second circuit interconnect card 204.

In addition, when the bandwidth of the first CEM slot 311 inserted with the first circuit interconnect card 10 is X16 and the bandwidth of the second CEM slot 312 inserted with the second circuit interconnect card 201 is X16, electrical connection through the FFCs can be that the first FFC interface 141 of the first circuit interconnect card 10 is electrically connected to the second FFC interface 241 (alternatively, the second FFC interface 242) of the second circuit interconnect card 201 through FFC, and the first FFC interface 142 of the first circuit interconnect card 10 is electrically connected to the second FFC interface 242 (alternatively, the second FFC interface 241) of the second circuit interconnect card 201, through the FFCs.

In order to perform the self-check for the differential signals of the first CEM slot 311, the second CEM slot 312, the third CEM slot 313, the fourth CEM slot 314 and the fifth CEM slot 315, the central processing unit 33 generates differential signals and provides the differential signals to the first circuit interconnect card 10 through the first CEM slot 311, the first circuit interconnect card 10 then provides the differential signals to the second circuit interconnect card 201 and the second circuit interconnect card 202 which are connected to the first circuit interconnect card 10 through the FFCs, and the second circuit interconnect card 201 and the second circuit interconnect card 202 then provide the differential signals to the central processing unit through the second CEM slot 312 and the third CEM slot 313, so as to implement the self-check for differential signals of the first CEM slot 311, the second CEM slot 312 and the third CEM slot 313.

In order to perform the self-check for the differential signals of the fourth CEM slot 314 and the fifth CEM slot 315, the central processing unit 33 generates differential signals and provides the differential signals to the second circuit interconnect card 204 through the fifth CEM slot 315, and the second circuit interconnect card 204 then provides the differential signals to the second circuit interconnect card 203 which is connected to the second circuit interconnect card 204 through the FFC, and the second circuit interconnect card 203 then provides the differential signals to the central processing unit through the fourth CEM slot 314, so as to implement the self-check for the differential signals of the fourth CEM slot 314 and the fifth CEM slot 315; however, these examples are merely for exemplary illustration, and the application field of the present invention is not limited to these examples. The testing process for another CEM slot can be deduced in reference with the above-mentioned descriptions.

The output serial data communication standard interface 32 is electrically connected to the first input serial data communication standard interface 15 of the first circuit interconnect card 10, the first output serial data communication standard interface 16 of the first circuit interconnect card 10 is electrically connected to the second input serial data communication standard interface 25 of the second circuit interconnect card 201, the second output serial data communication standard interface 26 of the second circuit interconnect card 201 is electrically connected to the second input serial data communication standard interface 25 of the second circuit interconnect card 202, the second output serial data communication standard interface 26 of the second circuit interconnect card 202 is electrically connected to the second input serial data communication standard interface 25 of the second circuit interconnect card 203, the second output serial data communication standard interface 26 of the second circuit interconnect card 203 is electrically connected to the second input serial data communication standard interface 25 of the second circuit interconnect card 204, and the second output serial data communication standard interface 26 of the second circuit interconnect card 204 is floated.

A test program is stored in the storage unit 34, and can be loaded and executed by the central processing unit 33 to generate a detection signal, the test program transmits the detection signal to at least corresponding one of the first circuit interconnect card 10 and second circuit interconnect cards 201, 202, 203 and 204 through the output serial data communication standard interface 32, and the first input serial data communication standard interface 15 of the first circuit interconnect card 10, the first output serial data communication standard interface 16 of the first circuit interconnect card 10, the second input serial data communication standard interfaces 25 and the second output serial data communication standard interfaces 26 of the second circuit interconnect cards 201, 202, 203 and 204, so as to perform detection for signal link and pin status of at least one of the first CEM slot 311, the second CEM slot 312, the third CEM slot 313, the fourth CEM slot 314 and the fifth CEM slot 315 of the board under test 30 based on the detection signal. At least one of the first test logic circuit 11 and the second test logic circuits 21 can perform detection for operations of reading a status, measuring a voltage on the power pin and/or transmitting a wake signal of the at least corresponding one of the first CEM slot 311, the second CEM slot 312, the third CEM slot 313, the fourth CEM slot 314 and the fifth CEM slot 315 to generate a detection result, through the board under test 30 and at least one of the first CEM insertion interface 13 and the second CEM insertion interface 23; at least one of the first test logic circuit 11 and the second test logic circuits 21 can transmit the detection result back to the test program through the output serial data communication standard interface 32, the first input serial data communication standard interface 15 and the first output serial data communication standard interface 16 of the first circuit interconnect card 10, the second input serial data communication standard interfaces 25 and the second output serial data communication standard interfaces 26 of the second circuit interconnect cards 201, 202, 203 and 204, so as to implement detection for the non-differential signal pins of at least one of the first CEM slot 311, the second CEM slot 312, the third CEM slot 313, the fourth CEM slot 314 and the fifth CEM slot 315. The detection for each non-differential signal pin will be described in reference with the following embodiments.

In an embodiment, the first CEM slot 311, the second CEM slot 312, the third CEM slot 313, the fourth CEM slot 314 and the fifth CEM slot 315 are defined as downstream ports of the PCIe in the test program, the downstream port of the each PCIe is electrically connected to a register, and the registers can store data of the characteristics and statuses of the first CEM slot 311, the second CEM slot 312, the third CEM slot 313, the fourth CEM slot 314 and fifth CEM slot 315, respectively, so that the test program can perform the detections for the signal link and the pin status by reading the statuses of the registers corresponding to the first CEM slot 311, the second CEM slot 312, the third CEM slot 313, the fourth CEM slot 314 and the fifth CEM slot 315; in an embodiment, the above-mentioned detections for the signal link and pin status include detections for PCIe link speed, link width and link speed change.

The first test logic circuit 11 of the first circuit interconnect card 10 and the second test logic circuits 21 of the second circuit interconnect card 201, the second circuit interconnect card 202, the second circuit interconnect card 203 and the second circuit interconnect card 204 are configured to respectively perform voltage measurements for the power pins of the first CEM slot 311, the second CEM slot 312, the third CEM slot 313, the fourth CEM slot 314 and the fifth CEM slot 315, and then transmit the voltage measurement results of the power pins of the first CEM slot 311, the second CEM slot 312, the third CEM slot 313, the fourth CEM slot 314 and the fifth CEM slot 315 back to the test program through a universal asynchronous receiver/transmitter (UART) interface, so that the test program can complete the detection for the status of the power pin of at least one of the first CEM slot 311, the second CEM slot 312, the third CEM slot 313, the fourth CEM slot 314 and the fifth CEM slot 315.

Each of the first test logic circuit 11 of the first circuit interconnect card 10 and the second test logic circuit 21 of the second circuit interconnect card 20 includes an electrically-erasable programmable read-only memory (EEPROM), and the test program reads the EEPROM of the first test logic circuit 11 or the EEPROM of the second test logic circuit 21 through a system management bus, so as to perform the detection for signal link.

In an embodiment, the first test logic circuit 11 and the second test logic circuit 21 transmit wake signals in response to the detection signal, and a baseboard management controller (BMC) or an I/O controller hub (ICH) of the board under test 30 reads the wake signal; or, in another embodiment, the second test logic circuit 21 and the first test logic circuit 11 read the wake signals, and the second test logic circuit 21 and the first test logic circuit 11 then transmit the wake signals in response to the detection signal, and the BMC or the ICH of the board under test 30 reads the wake signal; or, in another embodiment, the first test logic circuit 11 and the second test logic circuit 21 read the wake signal, as a result, the detection for signal links of the first CEM slot 311, the second CEM slot 312, the third CEM slot 313, the fourth CEM slot 314 and the fifth CEM slot 315 can be performed.

In an embodiment, pull-up resistors and pull-down resistors can be respectively disposed between the first test logic circuit 11 and the first CEM slot 311, and between the second test logic circuit 21 and each of the second CEM slot 312, the third CEM slot 313, the fourth CEM slot 314 and the fifth CEM slot 315. The first test logic circuit 11 and the second test logic circuits 21 can read the signal statuses of the input/output pins (such as TMS, TDI, TDO, TCK, PWR-BRK and CLKREQ pins) of the first CEM slot 311, the second CEM slot 312, the third CEM slot 313, the fourth CEM slot 314 and the fifth CEM slot 315 by controlling the status (such as a pull-up status, a pull-down status or a non-up-down status) of the pull-up resistors and the pull-down resistors, so as to detect the voltage status of each of the input/output pins at high logic level, a low logic level or a NC level.

Figure 4A:
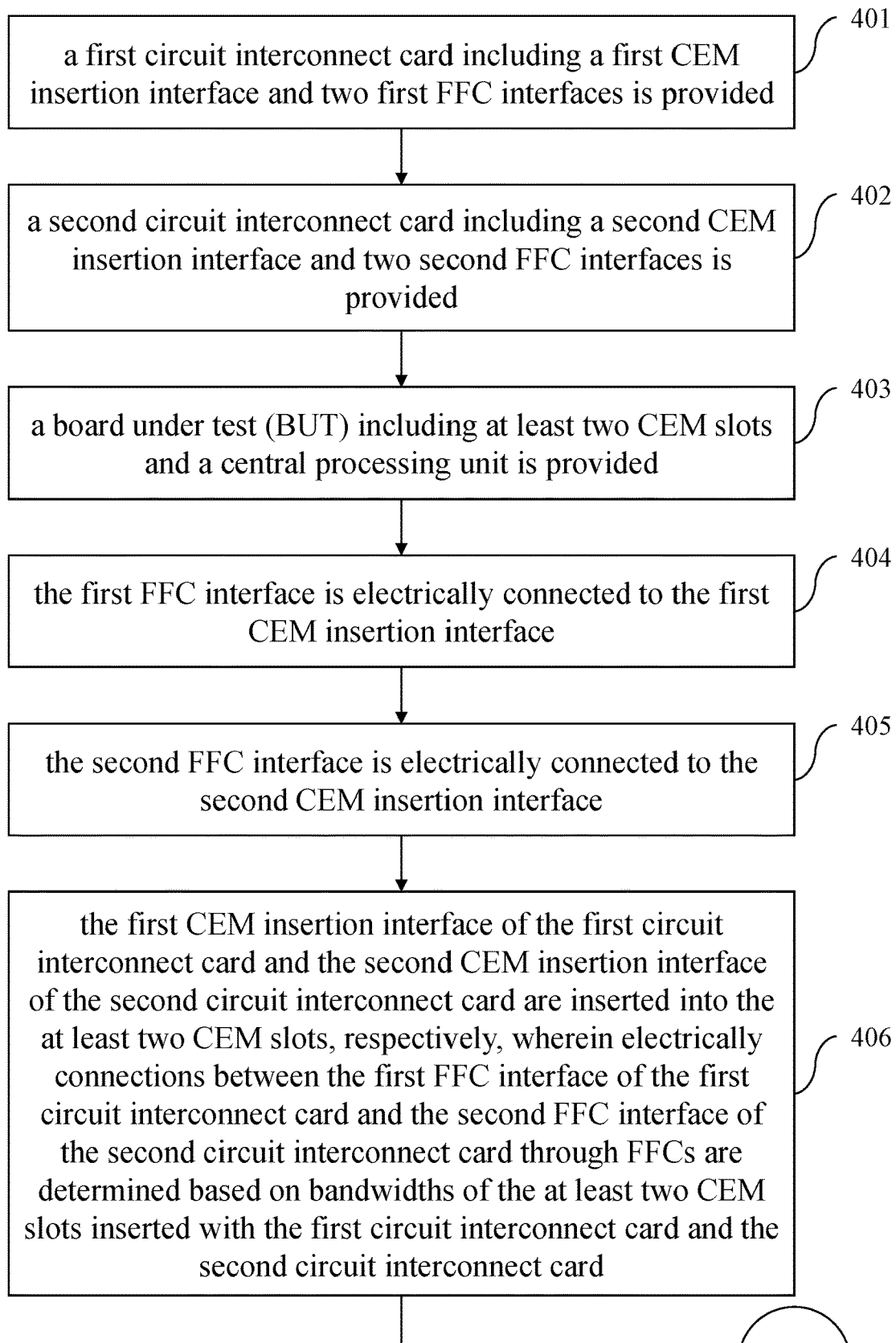
FIGS. 4A and 4B are flowcharts of a self-test method for PCIe, according to the present invention.
Figure 4B:
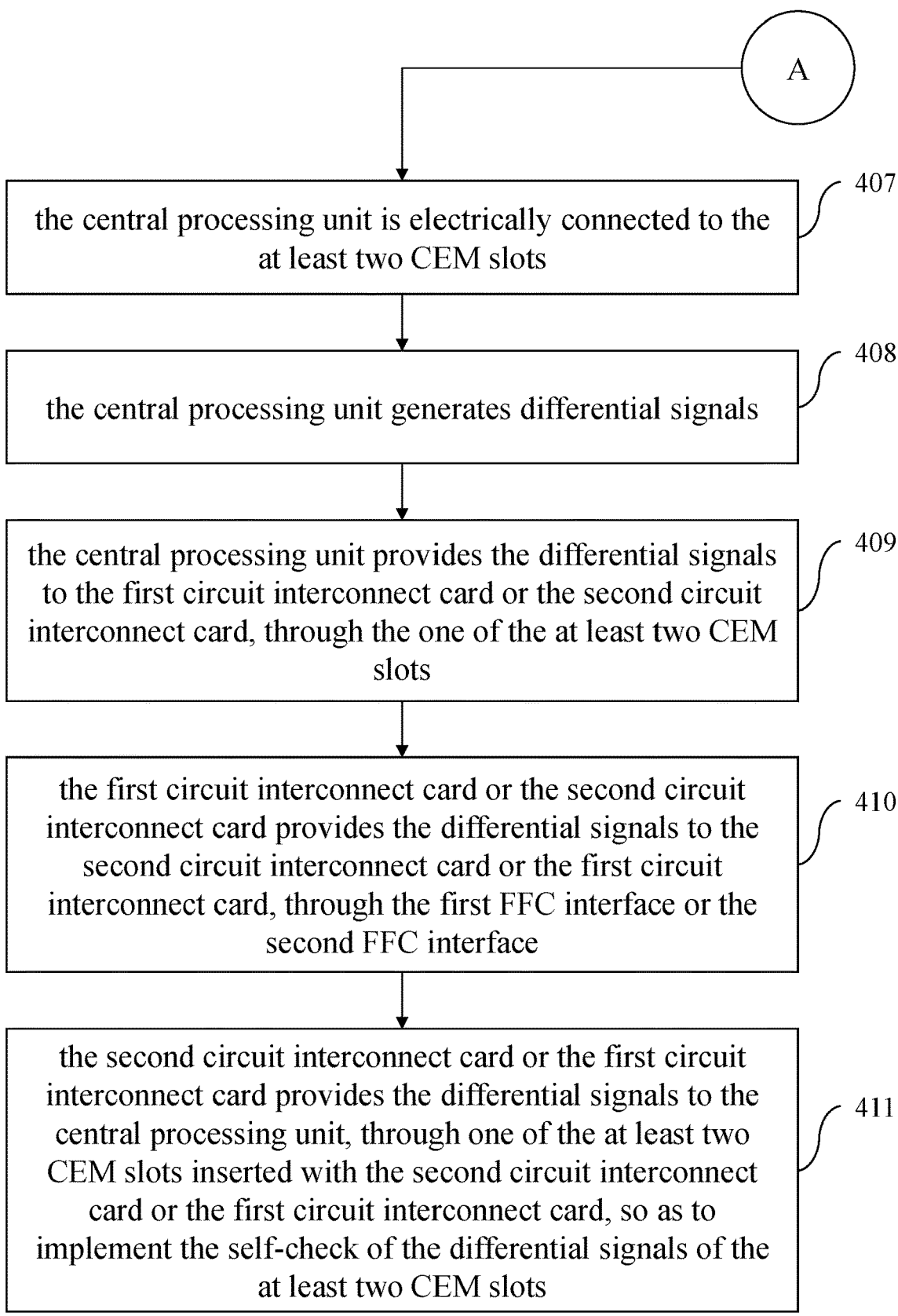

Please refer to FIGS. 4A and 4B, which are flowcharts of a self-test method for PCIe, according to the present invention.

As shown in FIGS. 4A and 4B, the self-test method includes the following steps. In a step 401, a first circuit interconnect card including a first CEM insertion interface and two first FFC interfaces is provided. In a step 402, a second circuit interconnect card including a second CEM insertion interface and two second FFC interfaces is provided. In a step 403, a board under test (BUT) including at least two CEM slots and a central processing unit is provided. In a step 404, the first FFC interface is electrically connected to the first CEM insertion interface. In a step 405, the second FFC interface is electrically connected to the second CEM insertion interface. In a step 406, the first CEM insertion interface of the first circuit interconnect card and the second CEM insertion interface of the second circuit interconnect card are inserted into the at least two CEM slots, respectively, wherein electrically connections between the first FFC interface of the first circuit interconnect card and the second FFC interface of the second circuit interconnect card through FFCs are determined based on bandwidths of the at least two CEM slots inserted with the first circuit interconnect card and the second circuit interconnect card. In a step 407, the central processing unit is electrically connected to the at least two CEM slots. In a step 408, the central processing unit generates differential signals. In a step 409, the central processing unit provides the differential signals to the first circuit interconnect card or the second circuit interconnect card, through the one of the at least two CEM slots. In a step 410, the first circuit interconnect card or the second circuit interconnect card provides the differential signals to the second circuit interconnect card or the first circuit interconnect card, through the first FFC interface or the second FFC interface. In a step 411, the second circuit interconnect card or the first circuit interconnect card provides the differential signals to the central processing unit, through one of the at least two CEM slots inserted with the second circuit interconnect card or the first circuit interconnect card, so as to implement the self-check of the differential signals of the at least two CEM slots.

According to above-mentioned contents, the difference between the present invention and the conventional technology is that, in the invention, the first circuit interconnect card and a second circuit interconnect card are inserted into the CEM slots, respectively, and the first circuit interconnect card and the second circuit interconnect card are electrically connected to each other through the FFC; the central processing unit generates and provides the differential signals to the first circuit interconnect card or the second circuit interconnect card, and the first circuit interconnect card or the second circuit interconnect card provides differential signals to the second circuit interconnect card or the first circuit interconnect card through the first FFC interface and the second FFC interface; the second circuit interconnect card or the first circuit interconnect card then provides the differential signals to the central processing unit, so as to implement the self-test for the differential signals of the CEM slots.

Therefore, the technical solution of the present invention is able to solve the problem that the conventional PCIe test performing full data transmission test causes inconvenience in test, so as to achieve the technical effect of implementing self-check for differential signal of PCIe by using the circuit interconnect card.

The present invention disclosed herein has been described by means of specific embodiments. However, numerous modifications, variations and enhancements can be made thereto by those skilled in the art without departing from the spirit and scope of the disclosure set forth in the claims.

What is claimed is:
1. A self-test system for peripheral component interconnect express (PCIe), comprising:
a first circuit interconnect card comprising:
a first card electromechanical (CEM) insertion interface; and
two first flexible flat cable (FFC) interfaces electrically connected to the first CEM insertion interface;
at least one second circuit interconnect card, wherein each of the at least one second circuit interconnect card comprises:
a second CEM insertion interface; and
two second FFC interfaces electrically connected to the second CEM insertion interface; and
a board under test comprising:
at least two CEM slots, wherein the at least two CEM slots are inserted with the first CEM insertion interface of the first circuit interconnect card and the second CEM insertion interface of the at least one second circuit interconnect card, respectively, wherein electrical connections between the two first FFC interfaces of the first circuit interconnect card and the two second FFC interfaces of the second circuit interconnect card through FFCs are determined based on bandwidths of the at least two CEM slots respectively inserted with the first circuit interconnect card and the at least one second circuit interconnect card; and
a central processing unit electrically connected to the at least two CEM slots, and configured to generate and provide differential signals to one of the first circuit interconnect card and the second circuit interconnect card through the corresponding one of the at least two CEM slots, wherein the first circuit interconnect card or the second circuit interconnect card provides the differential signals to the second circuit interconnect card or the first circuit interconnect card through the first FFC interface or the second FFC interface, and the second circuit interconnect card or the first circuit interconnect card provides the differential signals to the central processing unit through the at least two CEM slots inserted with the another second circuit interconnect card and the first circuit interconnect card, so as to implement the self-check of the differential signals for the at least two CEM slots.

2. The self-test system for PCIe according to claim 1, wherein the first circuit interconnect card comprises a first test logic circuit, a first communication unit, a first input serial data communication standard interface and a first output serial data communication standard interface, the first communication unit is electrically connected to the first communication unit, the first test logic circuit is electrically connected to the first CEM insertion interface, and the first communication unit is electrically connected to the first input serial data communication standard interface and the first output serial data communication standard interface.

3. The self-test system for PCIe according to claim 2, wherein the each of the at least one second circuit interconnect card comprises a second test logic circuit, a second communication unit, a second input serial data communication standard interface, and a second output serial data communication standard interface, the second test logic circuit is electrically connected to the second communication unit, the second test logic circuit is electrically connected to the second CEM insertion interface, the second communication unit is electrically connected to the second input serial data communication standard interface and the second output serial data communication standard interface, and the second input serial data communication standard interface is electrically connected to the first output serial data communication standard interface or another second output serial data communication standard interface, and the second output serial data communication standard interface is floated or is electrically connected to another second input serial data communication standard interface.

4. The self-test system for PCIe according to claim 3, wherein the board under test comprises a storage unit and an output serial data communication standard interface, the storage unit and the output serial data communication standard interface are electrically connected to the central processing unit, and the output serial data communication standard interface is electrically connected to the first input serial data communication standard interface, the storage unit stores a test program, the test program is loaded and executed by the central processing unit to generate a detection signal, the test program transmits the detection signal to the corresponding one of the first circuit interconnect card and second circuit interconnect card through the output serial data communication standard interface, the first input serial data communication standard interface, the first output serial data communication standard interface, the second input serial data communication standard interface and the second output serial data communication standard interface.

5. The self-test system for PCIe according to claim 4, wherein the first test logic circuit and/or the second test logic circuit performs detection to generate a detection result in response to the detection signal or the first test logic circuit and/or the second test logic circuit performs detection includes reading a CEM slot status, measuring the voltage on a power pin and detecting transmission of a wake signal through the at least two CEM slots and the first CEM insertion interface and/or the second CEM insertion interface to generate the detection result in response to the detection signal, and then transmits the detection result back to the test program through the output serial data communication standard interface, the first input serial data communication standard interface, the first output serial data communication standard interface, the second input serial data communication standard interface, and the second output serial data communication standard interface, so as to implement the detection for non-differential signal pins of the at least two CEM slots.

6. A self-test method for peripheral component interconnect express (PCIe),
providing a first circuit interconnect card comprising a first card electromechanical (CEM) insertion interface and two first flexible flat cable (FFC) interfaces;
providing a second circuit interconnect card comprising a second CEM insertion interface and two second FFC interfaces;
providing a board under test (BUT) comprising at least two CEM slots and a central processing unit;
electrically connecting the first FFC interface and the first CEM insertion interface;
electrically connecting the second FFC interface and the second CEM insertion interface;
inserting the first CEM insertion interface of the first circuit interconnect card and the second CEM insertion interface of the second circuit interconnect card into the at least two CEM slots, respectively, wherein electrically connections between the first FFC interface of the first circuit interconnect card and the second FFC interface of the second circuit interconnect card through FFCs is determined based on bandwidths of the at least two CEM slots inserted with the first circuit interconnect card and the second circuit interconnect card;
electrically connecting the central processing unit and the at least two CEM slots;
generating differential signals by the central processing unit;
providing the differential signals to the first circuit interconnect card or the second circuit interconnect card by the central processing unit, through the one of the at least two CEM slots;
providing the differential signals to the second circuit interconnect card or the first circuit interconnect card by the first circuit interconnect card or the second circuit interconnect card, through the first FFC interface or the second FFC interface; and
providing the differential signals to the central processing unit by the second circuit interconnect card or the first circuit interconnect card, through one of the at least two CEM slots inserted with the second circuit interconnect card or the first circuit interconnect card, so as to implement the self-check of the differential signals of the at least two CEM slots.

7. The self-test method for PCIe according to claim 6, wherein the first circuit interconnect card comprises a first test logic circuit, a first communication unit, a first input serial data communication standard interface, and a first output serial data communication standard interface, and the self-test method further comprises:
electrically connecting the first test logic circuit to the first communication unit;
electrically connecting the first test logic circuit to the first CEM insertion interface; and
electrically connecting the first communication unit to the first input serial data communication standard interface and the first output serial data communication standard interface.

8. The self-test method for PCIe according to claim 6, wherein the second circuit interconnect card comprises a second test logic circuit, a second communication unit, a second input serial data communication standard interface, and a second output serial data communication standard interface, and the self-test method further comprises:
electrically connecting the second test logic circuit to the second communication unit;
electrically connecting the second test logic circuit to the second CEM insertion interface;
electrically connecting the second communication unit to the second input serial data communication standard interface and the second output serial data communication standard interface;
electrically connecting the second input serial data communication standard interface to the first output serial data communication standard interface or another second output serial data communication standard interface; and
floating the second output serial data communication standard interface, or electrically connecting the second output serial data communication standard interface to another second input serial data communication standard interface.

9. The self-test method for PCIe according to claim 6, wherein the board under test comprises a storage unit and an output serial data communication standard interface, and the self-test method further comprises:
electrically connecting the central processing unit to the storage unit and the output serial data communication standard interface;
electrically connecting the output serial data communication standard interface to the first input serial data communication standard interface;

storing a test program in the storage unit, and loading and executing the test program to generate a detection signal by the central processing unit;

transmitting the detection signal to at least corresponding one of the first circuit interconnect card and the second circuit interconnect card by the test program through the output serial data communication standard interface, the first input serial data communication standard interface, the first output serial data communication standard interface, the second input serial data communication standard interface and the second output serial data communication standard interface.

10. The self-test method for PCIe according to claim 6, wherein self-test method for PCIe comprising:

performing detection to generate a detection result by the first test logic circuit and/or the second test logic circuit in response to the detection signal, and performing detection includes reading a CEM slot status, measuring a voltage on a power pin, and detecting transmission of a wake signal through the at least two CEM slots and the first CEM insertion interface and/or the second CEM insertion interface to generate the detection result in response to the detection signal; and transmitting the detection result back to the test program by at least one of the first test logic circuit and the second test logic circuit through the output serial data communication standard interface, the first input serial data communication standard interface, the first output serial data communication standard interface, and the second input serial data communication standard interface and the second output serial data communication standard interface, so as to implement the detection for non-differential signal pins of at least two CEM slots.

\* \* \* \* \*